United States Patent
Hirayama et al.

(10) Patent No.: US 7,859,007 B2
(45) Date of Patent: Dec. 28, 2010

(54) LIGHT-EMITTING DEVICE AND MANUFACTURING METHOD THEREOF

(75) Inventors: Hideki Hirayama, Wako (JP); Katsushi Akita, Itami (JP); Takao Nakamura, Itami (JP)

(73) Assignees: Sumitomo Electric Industries, Ltd., Osaka-shi (JP); RIKEN, Wako-shi (JP)

( * ) Notice: Subject to any disclaimer, the term of this patent is extended or adjusted under 35 U.S.C. 154(b) by 0 days.

(21) Appl. No.: 10/916,802

(22) Filed: Aug. 11, 2004

(65) Prior Publication Data

US 2005/0040414 A1 Feb. 24, 2005

(30) Foreign Application Priority Data

Aug. 20, 2003 (JP) .............................. 2003-296474
Jun. 30, 2004 (JP) .............................. 2004-193809

(51) Int. Cl.
H01L 31/075 (2006.01)

(52) U.S. Cl. ............... 257/102; 257/103; 257/E33.028; 257/E33.031

(58) Field of Classification Search ................... 257/94, 257/96, 97, E33.028, 102, 103, E33.031
See application file for complete search history.

(56) References Cited

U.S. PATENT DOCUMENTS

| | | | |
|---|---|---|---|
| 5,798,537 A * | 8/1998 | Nitta | ............................ 257/103 |
| 6,399,966 B1 | 6/2002 | Tsuda et al. | |
| 6,468,882 B2 | 10/2002 | Motoki et al. | |
| 6,515,313 B1 | 2/2003 | Ibbetson et al. | |
| 6,549,552 B1 * | 4/2003 | Omi et al. | ................. 372/45.01 |
| 6,849,878 B2 | 2/2005 | Bader et al. | |
| 6,881,983 B2 * | 4/2005 | Narayan et al. | ............... 257/94 |
| 6,887,311 B2 | 5/2005 | Fudeta et al. | |
| 6,936,488 B2 * | 8/2005 | D'Evelyn et al. | ............. 438/22 |
| 6,969,874 B1 * | 11/2005 | Gee et al. | ...................... 257/98 |
| 2001/0028064 A1 | 10/2001 | Hirayama et al. | |
| 2001/0030316 A1 | 10/2001 | Kuramoto et al. | |
| 2001/0030318 A1 | 10/2001 | Nakamura et al. | |
| 2001/0055660 A1 | 12/2001 | Tischler et al. | |
| 2002/0053665 A1 | 5/2002 | Tsuda et al. | |

(Continued)

FOREIGN PATENT DOCUMENTS

JP 2000-349396 12/2000

(Continued)

OTHER PUBLICATIONS

T. Nishida et al., "Efficient and high-power AlGaN-based ultraviolet light-emitting diode grown on bulk GaN", Applied Physics Letters, vol. 79, No. 6, Aug. 6, 2001, pp. 711-712.

(Continued)

*Primary Examiner*—Allan R Wilson
(74) *Attorney, Agent, or Firm*—W. F. Fasse; W. G. Fasse (57) ABSTRACT

To provide a light-emitting device using a nitride semiconductor which can attain high-power light emission by highly efficient light emission and a manufacturing method thereof, the light-emitting device includes a GaN substrate and a light-emitting layer including an InAlGaN quaternary alloy on a side of a first main surface of GaN substrate.

17 Claims, 5 Drawing Sheets

U.S. PATENT DOCUMENTS

2002/0096674 A1 7/2002 Cho et al.
2003/0006418 A1* 1/2003 Emerson et al. ............... 257/79

FOREIGN PATENT DOCUMENTS

| JP | 2001-160539 | 6/2001 |
|---|---|---|
| JP | 2001237455 | 8/2001 |
| JP | 2002-026459 | 1/2002 |
| JP | 2002-084040 | 3/2002 |
| JP | 2002-280610 | 9/2002 |
| JP | 2002-335052 | 11/2002 |
| JP | 2003-086533 | 3/2003 |
| JP | 2003-115642 | 4/2003 |
| JP | 2003-142732 | 5/2003 |
| JP | 2003-527745 | 9/2003 |
| JP | 2004-200347 | 7/2004 |
| TW | 494583 | 7/2002 |
| WO | WO 02/19439 | 3/2002 |

OTHER PUBLICATIONS

S. Einfeldt et al., "Strain relaxation in AlGaN under tensile plane stress", Journal of Applied Physics, vol. 88, No. 12, Dec. 15, 2000, pp. 7029-7036.

Office Action in U.S. Appl. No. 11/818,024, mailed Feb. 26, 2008, 8 pages, USPTO, Alexandria, VA, USA.

Office Action in U.S. Appl. No. 11/818,024, mailed Oct. 20, 2008, 9 pages, USPTO, Alexandria, VA, USA.

Office Action in U.S. Appl. No. 11/818,024, mailed Apr. 28, 2009, 11 pages, USPTO, Alexandria, VA, USA.

Office Action in U.S. Appl. No. 11/818,024, mailed Nov. 30, 2009, 10 pages, USPTO, Alexandria, VA, USA.

Office Action in Taiwanese Pat. App. No. 093123921, mailed Jan. 12, 2010 (5 pages), plus Taiwanese search report (1 page), with English translation (7 pages).

European Search Report for Application EP 04019227.0, dated Jul. 29, 2010, 3 pages, European Patent Office, HV Rijswijk, Netherlands.

* cited by examiner

LIGHT-EMITTING DEVICE AND MANUFACTURING METHOD THEREOF

BACKGROUND OF THE INVENTION

1. Field of the Invention

The present invention relates to a light-emitting device and a manufacturing method thereof. More-specifically, the present invention relates to a light-emitting device using a nitride semiconductor emitting ultraviolet light and a manufacturing method thereof.

2. Description of the Background Art

A GaN-based compound semiconductor functions as a blue LED (Light Emitting Diode) or an ultraviolet LED because of its large band gap, and is often used as an excitation light source of a white LED. Suggestions such as the following have been made for improvement of performance of the GaN-based LED which emits ultraviolet light having a short wavelength.

(d1) Using a SiC substrate and an InAlGaN layer as a light-emitting layer, and adjusting a composition of In, for example, in the InAlGaN layer to increase efficiency of light emission within an ultraviolet region of 360 nm or shorter wavelengths (Japanese Patent Laying-Open No. 2001-237455).

(d2) Using as a light-emitting layer a single-layer quantum well structure formed with $Al_{0.1}Ga_{0.9}N$ layer/$Al_{0.4}Ga_{0.6}N$ layer formed on a GaN substrate to increase brightness (T. Nishida, H. Saito, N. Kobayashi; Appl. Phys. Lett., Vol. 79 (2001) 711).

The above-described ultraviolet light-emitting device, however, has low light emission efficiency, and the light emission efficiency decreases because of heat production when a large current is passed for use in illumination. A reason for the low light emission efficiency of the aforementioned ultraviolet light-emitting device is its high dislocation density in the substrate and the light-emitting layer, which dislocation works as a non-radiative center. In particular, when a sapphire substrate is used, it does not dissipate heat efficiently and there is a strong tendency of light emission efficiency not to increase linearly in proportion to an input, but to be saturated halfway.

SUMMARY OF THE INVENTION

An object of the present invention is to provide a light-emitting device enabling highly efficient light emission and high-power light emission and a manufacturing method thereof.

A light-emitting device according to the present invention includes a light-emitting layer including an InAlGaN quaternary alloy on a side of a first main surface of a nitride semiconductor substrate.

According to the above-described construction, as the nitride semiconductor substrate having a low dislocation density is used, a density of threading dislocations operating as non-radiative centers in the light-emitting device can be decreased to increase light emission efficiency. In addition, the light emission efficiency can further be increased with a composition modulation effect by In included in the InAlGaN quaternary alloy. It is to be noted that, the nitride semiconductor substrate has conductivity of a first conductivity type, and can be any nitride semiconductor such as a GaN substrate, an $Al_xGa_{1-x}N$ substrate ($0<x\leq 1$), or an AlN substrate included in the $Al_xGa_{1-x}N$ substrate.

Another light-emitting device according to the present invention has an $Al_{x1}Ga_{1-x1}N$ layer ($0\leq x1\leq 1$) of a first conductivity type, an $Al_{x2}Ga_{1-x2}N$ layer ($0\leq x2\leq 1$) of a second conductivity type located above the $Al_{x1}Ga_{1-x1}N$ layer of the first conductivity type, and a light-emitting layer located between the $Al_{x1}Ga_{1-x1}N$ layer of the first conductivity type and the $Al_{x2}Ga_{1-x2}N$ layer of the second conductivity type and including an InAlGaN quaternary alloy, and includes a nitride semiconductor layer having thickness of at most 100 µm in a more distant position from the light-emitting layer than that of the $Al_{x1}Ga_{1-x1}N$ layer of the first conductivity type.

The nitride semiconductor layer having thickness of at most 100 µm is formed by etching or abrasion of the aforementioned nitride semiconductor substrate in the present invention. With this construction, absorption by the nitride semiconductor substrate can be inhibited in addition to decreasing the density of threading dislocations operating as non-radiative centers and obtaining the composition modulation effect by In included in the InAlGaN quaternary alloy.

A manufacturing method of a light-emitting device according to the present invention includes the steps of forming an $Al_{x1}Ga_{1-x1}N$ layer ($0\leq x1\leq 1$) of a first conductivity type on a side of a first main surface of a nitride semiconductor substrate, forming a light-emitting layer including an InAlGaN quaternary alloy on the $Al_{x1}Ga_{1-x1}N$ layer of the first conductivity type, forming an $Al_{x2}Ga_{1-x2}N$ layer ($0\leq x2\leq 1$) of a second conductivity type on the light-emitting layer, and removing the nitride semiconductor substrate after forming the $Al_{x2}Ga_{1-x2}N$ layer of the second conductivity type.

As GaN, for example, absorbs ultraviolet light having a wavelength of 360 nm or shorter, a light output can be increased by the removing or abrasion of the GaN substrate according to the above-described method. As a result, the light output can further be increased. Other nitride semiconductor may also absorb light of a wavelength region which is desired to be taken out, and in such situation, the light output can be increased by removing the nitride semiconductor substrate.

It is to be noted that, "a B layer is located above an A layer" means that the B layer is located in a more distant position from the nitride semiconductor substrate than that of the A layer. The B layer may or may not contact the A layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described.

First Embodiment

Figure 1:
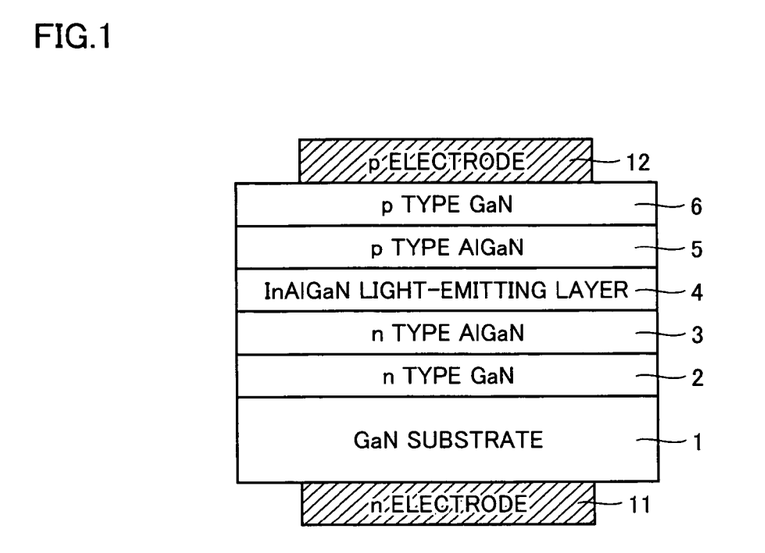
FIG. 1 shows an ultraviolet LED according to a first embodiment of the present invention.

FIG. 1 shows an LED according to a first embodiment of the present invention. In FIG. 1, a stacked structure (an n type GaN layer 2/an n type $Al_xGa_{1-x}N$ layer 3/an InAlGaN light-emitting layer 4/a p type $Al_xGa_{1-x}N$ layer 5/a p type GaN layer 6) is formed on a GaN substrate 1. An n electrode 11 is arranged on a second main plane, that is, a backside of GaN substrate 1, while a p electrode 12 is arranged on p type GaN layer 6. Ultraviolet light is emitted from the InAlGaN light-emitting layer by applying a current to the pair of n electrode 11 and p electrode 12. The InAlGaN light-emitting layer has a composition of $In_{xa}Al_{ya}Ga_{1-xa-ya}N$.

The GaN-based LED shown in FIG. 1 is manufactured by the following processing steps. A GaN substrate having thickness of 400 μm, a dislocation density of 5E6 $cm^{-2}$ and a resistivity of 1E-2 Ωcm was arranged on a susceptor within an MOCVD (Metal Organic Chemical Vapor Deposition) device. While the inside of the deposition reactor was kept decompressed, a stacked structure was formed by an MOCVD method described below to manufacture an ultraviolet light-emitting diode.

As materials for the MOCVD, trimethylgallium, trimethylaluminum, trimethylindium adduct, ammonia, tetraethylsilane, and bis(ethylcyclopentadienyl)magnesium were used. First, n type GaN layer 2 having thickness of 0.1 μm was formed as a ground layer on GaN substrate 1 at a growth temperature of 1050° C., and then n type $Al_{0.18}Ga_{0.82}N$ layer 3 having thickness of 0.2 μm was formed thereon.

Thereafter, the growth temperature was decreased to 830° C., and InAlGaN light-emitting layer 4 of 60 nm was grown. Flow rates of material gases in this step were as follows: 2 l/min for ammonia, 3 μmol/min for trimethylgallium, 0.5 μmol/min for trimethylaluminum, and 60 μmol/min for trimethylindium adduct. Then, the growth temperature was increased again to 1050° C., and p type $Al_{0.18}Ga_{0.82}N$ layer 5 having thickness of 0.2 μm was formed. Furthermore, the p type GaN layer having thickness of 30 nm was grown thereon as a contact layer.

To an LED epitaxial structure grown as above, semitransparent p electrode 12 was formed on p type GaN layer 6 and n electrode 11 was formed on a second main plane of the GaN substrate opposite to the epitaxial layer (backside) with suitable metal materials. The ultraviolet light-emitting diode manufactured as above has a structure as shown in FIG. 1.

Figure 2:
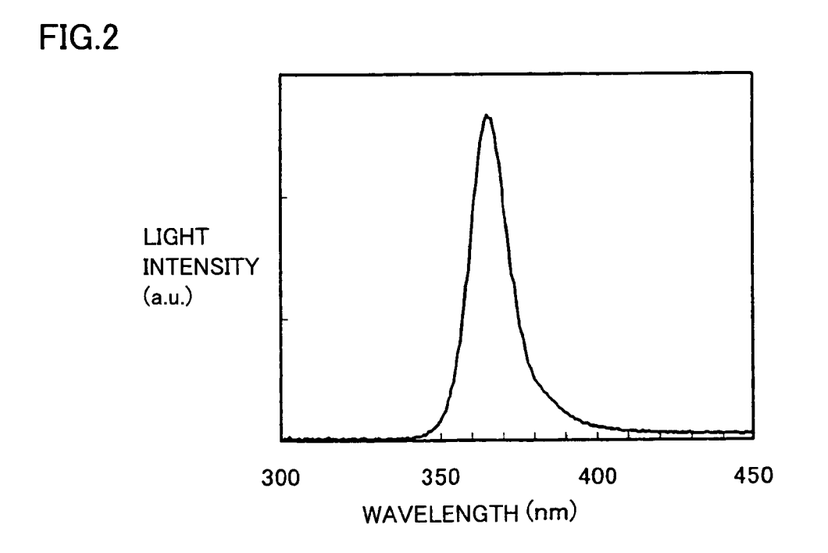
FIG. 2 shows an emission spectrum of the ultraviolet LED shown in FIG. 1.
Figure 3:
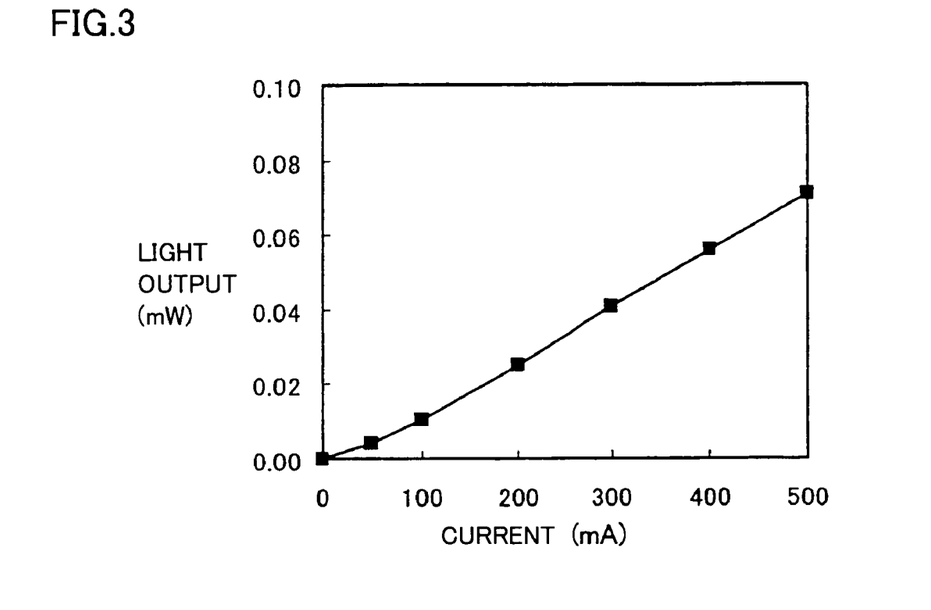
FIG. 3 shows a relation between an applied current and a light output of the ultraviolet LED shown in FIG. 1.

When a continuous current was applied to the above-described ultraviolet light-emitting diode, a band-edge emission of the InAlGaN light-emitting layer at a wavelength of 360 nm was obtained, as shown in FIG. 2. Even when a value of the applied current was increased up to 300 mA, the light output was increased linearly without being saturated, as shown in FIG. 3. This result has demonstrated a high heat dissipation property of the GaN substrate. In addition, as a substrate having a low dislocation density was used as the GaN substrate in this embodiment, the threading dislocation density was decreased and light emission efficiency could be increased.

Second Embodiment

Figure 4:
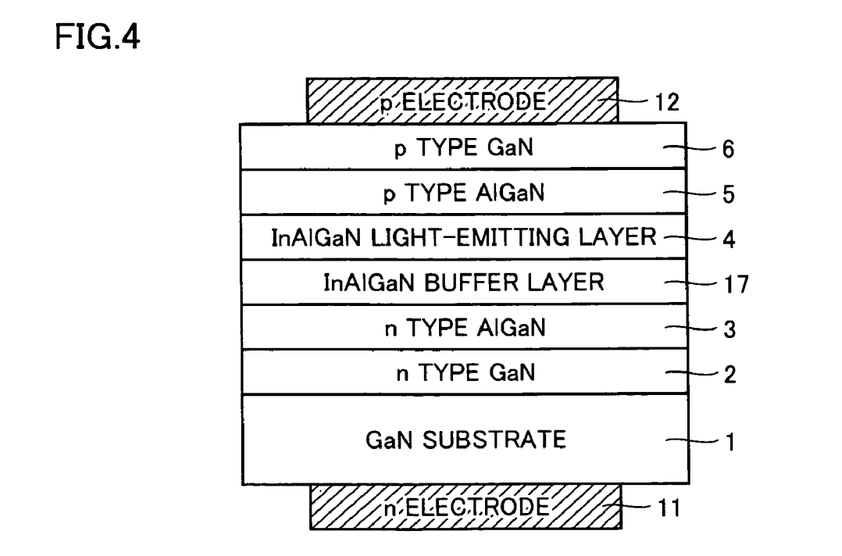
FIG. 4 shows an ultraviolet LED according to a second embodiment of the present invention.

FIG. 4 shows an ultraviolet light-emitting diode according to a second embodiment of the present invention. As compared with the stacked structure of the ultraviolet LED shown in FIG. 1, this ultraviolet light-emitting diode is characterized in that, an $In_xAl_yGa_{1-x-y}N$ layer 17 as a buffer layer is arranged in contact with light-emitting layer 4 on a side nearer to GaN substrate 1. In addition, the light-emitting layer has a multiple quantum well structure, which will be described below.

A manufacturing method of the ultraviolet LED according to this embodiment is as follows. A substrate having thickness of 400 μm and a threading dislocation density of 5E61 $cm^2$ was used as GaN substrate 1. N type GaN layer 2 and n type $Al_xGa_{1-x}N$ layer 3 were successively formed on GaN substrate 1 by a method similar to that in the first embodiment. Then, $In_xAl_yGa_{1-x-y}N$ buffer layer 17 having thickness of 50 nm was grown at a growth temperature of 830° C. in contact with n type $Al_xGa_{1-x}N$ layer 3.

Figure 5:
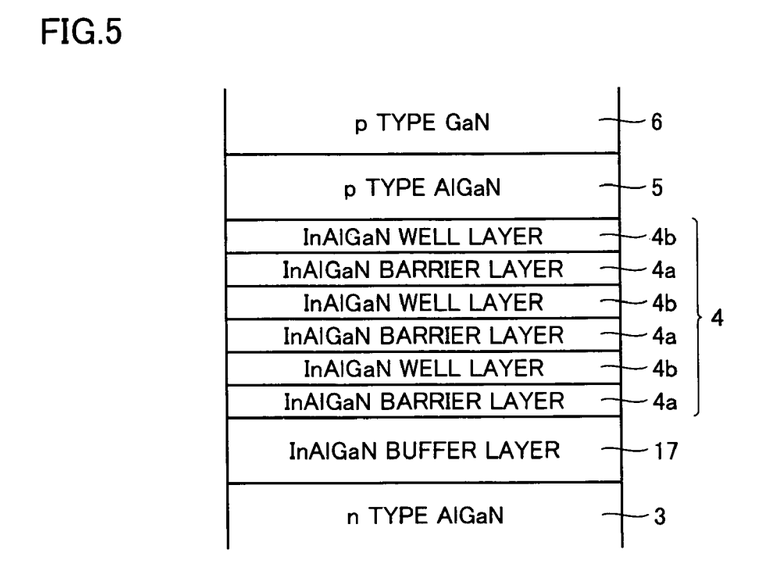
FIG. 5 is an enlarged view of a light-emitting layer shown in FIG. 4.

Thereafter, a two-layered structure (an $In_{x5}Al_{y5}Ga_{1-x5-y5}N$ barrier layer 4a/an $In_{x4}Al_{y4}Ga_{1-x4-y4}N$ well layer 4b) was stacked for three cycles on $In_xAl_yGa_{1-x-y}N$ buffer layer 17 to form the multiple quantum well structure, as shown in FIG. 5. In the second embodiment, this multiple quantum well structure constructs light-emitting layer 4.

Flow rates of material gases for growing the $In_xAl_yGa_{1-x-y}N$ buffer layer and the $In_{x5}Al_{y5}Ga_{1-x5-y5}N$ barrier layer were as follows: 2 l/min for ammonia, 1.5 μmol/min for trimethylgallium, 0.65 μmol/min for trimethylaluminum, and 30 μmol/min for trimethylindium adduct.

Flow rates of material gases for growing the $In_{x4}Al_{y4}Ga_{1-x4-y4}N$ well layer were as follows: 2 l/min for ammonia, 1.5 μmol/min for trimethylgallium, 0.52 μmol/min for trimethylaluminum, and 53 μmol/min for trimethylindium adduct.

This embodiment is different from the first embodiment in two points. That is, the $In_xAl_yGa_{1-x-y}N$ layer as a buffer layer was arranged, and the light-emitting layer was made to have the multiple quantum well structure of InAlGaN layers.

Figure 6:
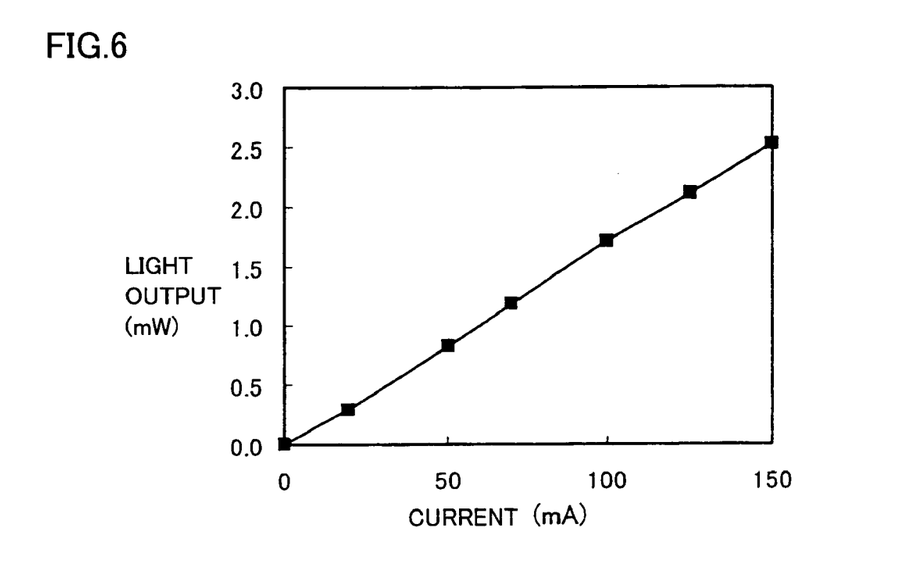
FIG. 6 shows a relation between an applied current and a light output of the ultraviolet LED shown in FIG. 4.
Figure 7:
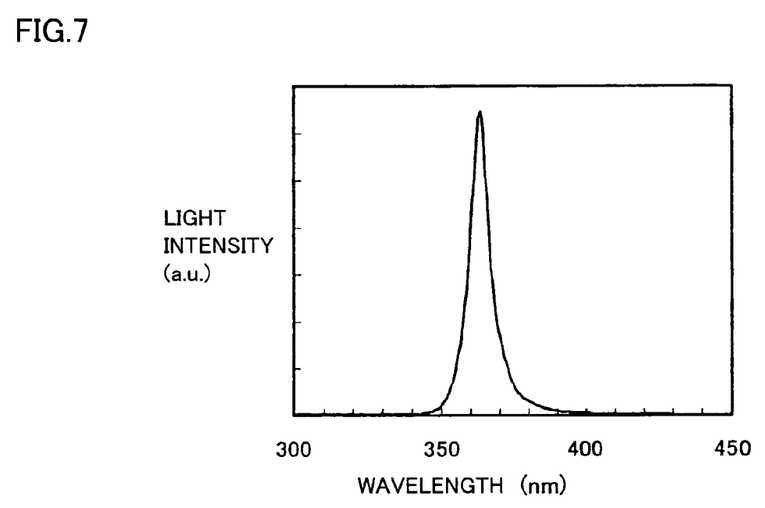
FIG. 7 shows an emission spectrum of the ultraviolet LED shown in FIG. 4.

With the above-described two improvements, a light emission output has markedly increased, as shown in FIG. 6. While the light output for the applied current of 100 mA was approximately 0.01 mW in FIG. 3, for example, the light output for the applied current of 100 mA in FIG. 6 was largely increased to 1.7 mW, that is, more than 150 times. In addition, a half-width of the emission spectrum was decreased to 12 nm, as shown in FIG. 7. This is because, as the light-emitting layer has the multiple quantum well structure, the light emission between quantum levels becomes dominant.

Third Embodiment

In a third embodiment of the present invention, light outputs were compared between an ultraviolet LED formed on the GaN substrate (an example of the present invention) and an ultraviolet LED formed on a GaN template (a substrate formed by growing an n type GaN for 3 μm on a sapphire substrate via a GaN buffer layer grown at low temperature) (an comparative example). The GaN template used was made previously. Both of the aforementioned example of the present invention and comparative example were formed to have stacked structures as shown in FIGS. 4 and 5 except that, as a backside of the GaN template is an insulator, the n electrode for the GaN template was formed on the previously exposed n type GaN layer.

For manufacturing, both GaN substrate and GaN template were arranged together on the susceptor within the MOCVD device. Then, the n type GaN layer, n type $Al_{x1}Ga_{1-x1}N$ layer and $In_xAl_yGa_{1-x-y}N$ layer as a buffer layer were formed on each of the GaN substrate and GaN template. Thereafter, a two-layered structure (an $In_{x4}Al_{y4}Ga_{1-x4-y4}N$ barrier layer/an $In_{x3}Al_{y3}Ga_{1-x3-y3}N$ well layer) was stacked for three cycles to form the multiple quantum well structure as in the second embodiment. Thereafter, a p type $Al_{x2}Ga_{1-x2}N$ layer/a p type GaN layer were formed, and the p electrode and n electrode were formed. During the above-described formation process, growth temperatures and flow rates of material gases were the same as those in the second embodiment. As described above, the n electrode for the GaN template was formed on the n type GaN layer.

Figure 8:
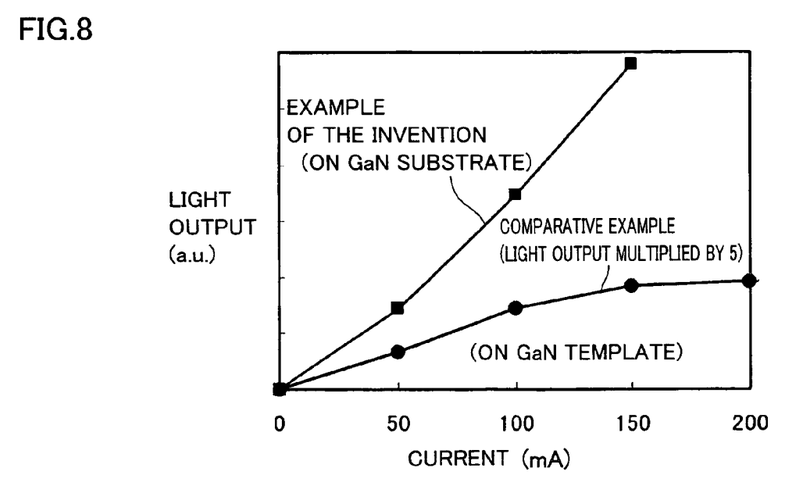
FIG. 8 shows respective relations between applied currents and light outputs of an ultraviolet LED of an example of the present invention according to a third embodiment of the present invention, and an ultraviolet LED of a comparative example.

Currents were applied to both of the example of the present invention and the comparative example manufactured as above, and the light outputs were measured. Results are shown in FIG. 8 in a comparative form. In FIG. 8, values corresponding to five times those of the actual light outputs are indicated for the comparative example using the GaN template.

According to FIG. 8, an output obtained with the LED on the GaN substrate with a current of 50 mA is about ten times that with the LED on the GaN template. In addition, though the output of the LED-using the GaN template tends to be saturated with a current of 100 mA, the output of the LED on the GaN substrate increases linearly. Therefore, the GaN substrate having a low dislocation density is effective in increasing efficiency of the ultraviolet LED using the InAlGaN light-emitting layer and increasing the output of LED by application of a large current. High power as described above with the LED of the example of the present invention could be obtained because an increase in temperature by heat emission was suppressed by using the GaN substrate having good heat conduction property, and non-radiative centers were decreased because of the low threading dislocation density.

Fourth Embodiment

Figure 9:
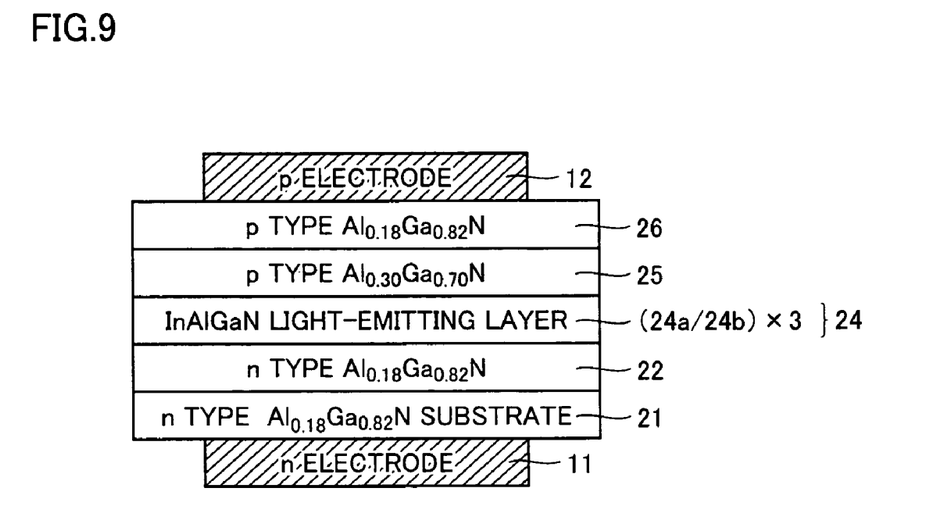
FIG. 9 shows a stacked structure of an ultraviolet LED according to a fourth embodiment of the present invention.

FIG. 9 shows a stacked structure of a light-emitting device according to a fourth embodiment of the present invention. First, a manufacturing method thereof will be described. An $Al_xGa_{1-x}N$ substrate (x=0.18) was arranged on a susceptor, and a stacked structure was manufactured while the inside of a metal organic chemical vapor deposition reactor was kept decompressed to obtain an ultraviolet light-emitting diode structure. Trimethylgallium, trimethylaluminum, trimethylindium adduct, ammonia, tetraethylsilane, and bis(ethylcyclopentadienyl)magnesium were used as materials. First, an n type $Al_{0.18}Ga_{0.82}N$ buffer layer 22 having thickness of 0.5 μm was grown at a growth temperature of 1050° C.

Thereafter, the growth temperature was decreased to 830° C. and a light-emitting layer 24 having three cycles of an InAlGaN barrier layer 24a and an InAlGaN well layer 24b was formed as the second embodiment described above. The growth temperature was then increased again to 1050° C. to grow a p type $Al_{0.30}Ga_{0.70}N$ layer 25 having thickness of 20 nm and a p type $Al_{0.18}Ga_{0.82}N$ layer 26 having thickness of 50 nm.

On p type AlGaN layer 26 of the LED epitaxial structure formed as above, semitransparent p electrode 12 was formed with a metal material, while n electrode 11 was formed on a backside of an AlGaN substrate 21.

When a continuous current was applied to the ultraviolet light-emitting diode formed as described above, a band-edge emission of the InAlGaN at a wavelength of 351 nm could be obtained. When the applied current was 100 mA, an 8 mW light output of the band-edge emission could be obtained.

Additional descriptions of embodiments of the present invention including the above-described embodiments are itemized in the following.

The aforementioned nitride semiconductor substrate can be a GaN substrate. Since a large and inexpensive GaN substrate is available, it is suitable for mass production. A threading dislocation density of the GaN substrate is preferably at most 1E7 $cm^{-2}$. With this, a threading dislocation density in the light-emitting device of the present invention can be decreased, and thus a density of non-radiative centers can be decreased.

In addition, the aforementioned nitride semiconductor substrate can be an $Al_xGa_{1-x}N$ substrate ($0<x\leq1$). Crystallinity of the InAlGaN light-emitting layer can be enhanced by using the $Al_xGa_{1-x}N$ substrate. That is, a difference of lattice constant between the light-emitting layer and the nitride semiconductor substrate can be decreased so that a lattice mismatch generated in the light-emitting layer can be suppressed.

A threading dislocation density of the $Al_xGa_{1-x}N$ substrate ($0<x\leq1$) is preferably at most 1E7 $cm^{-2}$. With this construction, a threading dislocation density in the light-emitting device of the present invention can be decreased, and thus a density of non-radiative centers can be decreased.

Band gap-energy of the $Al_xGa_{1-x}N$ substrate ($0<x\leq1$) can be made not more than energy corresponding to a wavelength of light emitted by the light-emitting layer including the InAlGaN quaternary alloy. With such band gap of the nitride semiconductor substrate, light emitted from the light-emitting layer is not absorbed by the nitride semiconductor substrate and can be utilized efficiently.

The construction may include an $Al_{x1}Ga_{1-x1}N$ layer ($0\leq x1\leq1$) of a first conductivity type on a side of a first main surface of the nitride semiconductor substrate, an $Al_{x2}Ga_{1-x2}N$ layer ($0\leq x2\leq1$) of a second conductivity type located in a more distant position from the nitride semiconductor substrate than that of the $Al_{x1}Ga_{1-x1}N$ layer of the first conductivity type, and the InAlGaN quaternary alloy between the $Al_{x1}Ga_{1-x1}N$ layer of the first conductivity type and the $Al_{x2}Ga_{1-x2}N$ layer of the second conductivity type.

With the construction as described above, highly effective light emission can be attained by passing a current from the p conductivity type layer and the n conductivity type layer to the InAlGaN quaternary alloy sandwiched therebetween.

The construction may include a nitride semiconductor layer of the same kind as the nitride semiconductor substrate of the first conductivity type between the nitride semiconductor substrate and the $Al_xGa_{1-x1}N$ layer of the first conductivity type.

With this construction, crystallinity of the $Al_{x1}Ga_{1-x1}N$ layer of the first conductivity type can be enhanced as compared with the structure including the $Al_{x1}Ga_{1-x1}N$ layer of the first conductivity type formed in contact with the nitride semiconductor substrate by allowing the nitride semiconductor layer of the same kind as the nitride semiconductor substrate of the first conductivity type to function as a buffer layer.

The construction may include an $Al_{x3}Ga_{1-x3}N$ layer ($0\leq x3<1$, $x3\leq x2$) of the second conductivity type having thickness of 1-500 nm on the $Al_{x2}Ga_{1-x2}N$ layer of the second conductivity type.

With the construction as described above, a contact resistance can be made lower as compared with the construction including the electrode formed in contact with the $Al_{x2}Ga_{1-x2}N$ layer of the second conductivity type, which can increase power-light conversion efficiency. The $Al_{x3}Ga_{1-x3}N$ layer of the second conductivity type having thickness smaller than 1 nm cannot provide a layer sufficient to decrease the contact resistance. In addition, an amount of absorption of ultraviolet light increases in the $Al_{x3}Ga_{1-x3}N$ layer having thickness larger than 500 nm. Therefore, the $Al_{x3}Ga_{1-x3}N$ layer of the second conductivity type should have the thickness within a range: 1-500 nm.

The construction can include a first electrode formed on a second main surface opposite to the first main surface, and a second electrode paired with the first electrode formed on the $Al_{x2}Ga_{1-x2}N$ layer of the second conductivity type.

With the construction as described above, as the first electrode can be arranged on the second main surface, that is, a backside of the nitride semiconductor substrate, a series resistance can be made smaller. As a result, voltage efficiency is increased and heat emission can be lowered, which can increase the light emission efficiency. Furthermore, the nitride semiconductor has a good thermal conductivity and is less susceptible to heat emission, which is also advantageous.

Total thickness of the $Al_{x1}Ga_{1-x1}N$ layer ($0 \leq x1 \leq 1$) of the first conductivity type and the $Al_{x2}Ga_{1-x2}N$ layer ($0 \leq x2 \leq 1$) of the second conductivity type may be at most 0.4 µm.

The total thickness of 0.4 µm or smaller is preferable because a crack will be generated when the total thickness of the $Al_{x1}Ga_{1-x1}N$ layer of the first conductivity type and the $Al_{x2}Ga_{1-x2}N$ layer of the second conductivity type becomes larger than 0.4 µm, and light will be emitted from only a portion of these layers.

The light-emitting device as described above can emit light within a wavelength range of 330-370 nm by light emission of the light-emitting layer.

By adjusting the light-emitting layer so as to radiate the wavelength within the aforementioned range, a light-emitting device of an ultraviolet region having high light emission efficiency can be attained.

The aforementioned light-emitting layer may have a construction having a quantum well structure including a well layer indicated as $In_{x4}Al_{y4}Ga_{1-x4-y4}N$ ($0<x4<0.2$, $0<y4<0.5$) and a barrier layer indicated as $In_{x5}Al_{y5}Ga_{1-x5-y5}N$ ($0 \leq x5<0.2$, $0<y5<0.5$).

The light emission efficiency can be increased substantially by making the light-emitting layer to have the quantum well structure. In addition, distortion can be decreased by using InAlGaN crystals for both the well and barrier layers, resulting in increase in the light emission efficiency.

The construction may include an $In_xAl_yGa_{1-x-y}N$ layer ($0<x<0.2$, $0<y<0.5$) having thickness of 10-200 nm between the light-emitting layer and the nitride semiconductor substrate.

With the construction as described above, strain of the light-emitting layer can be decreased, which can suppress spatial separation of electrons and holes by piezo effect and increase the light emission efficiency.

In another light-emitting device of the present invention, by etching or abrasion of the nitride semiconductor substrate, a nitride semiconductor layer in a more distant position from the light-emitting layer than that of the $Al_{x1}Ga_{1-x1}N$ layer of the first conductivity type may be absent.

With this construction, absorption of a short wavelength region by the nitride semiconductor substrate (nitride semiconductor layer) can be eliminated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An ultraviolet light-emitting device adapted to emit ultraviolet light in a wavelength range from 330 nm to less than 365 nm, said device comprising:
   a nitride semiconductor substrate having a dislocation density of at most $1E7\ cm^{-2}$;
   an ultraviolet light-emitting layer that is adapted to emit the ultraviolet light in the wavelength range from 330 nm to less than 365 nm, and that is formed as a single layer comprising an InAlGaN quaternary alloy on a side of a first main surface of said nitride semiconductor substrate;
   an $Al_{x1}Ga_{1-x1}N$ layer ($0<x1<1$) of a first conductivity type on the side of the first main surface of said nitride semiconductor substrate;
   an $Al_{x2}Ga_{1-x2}N$ layer ($0<x2<1$) of a second conductivity type located in a more distant position from said nitride semiconductor substrate than that of said $Al_{x1}Ga_{1-x1}N$ layer of the first conductivity type; and
   a first GaN layer of the first conductivity type and a second GaN layer of the second conductivity type arranged with said $Al_{x1}Ga_{1-x1}N$ layer of the first conductivity type and said $Al_{x2}Ga_{1-x2}N$ layer of the second conductivity type interposed between said first and second GaN layers;
   wherein said InAlGaN quaternary alloy of said light-emitting layer is located between said $Al_{x1}Ga_{1-x1}N$ layer of the first conductivity type and said $Al_{x2}Ga_{1-x2}N$ layer of the second conductivity type;
   wherein a composition ratio (x1, x2) of Al in said $Al_{x1}Ga_{1-x1}N$ layer of the first conductivity type and in said $Al_{x2}Ga_{1-x2}N$ layer of the second conductivity type is smaller than a composition ratio (1-x1, 1-x2) of Ga in said $Al_{x1}Ga_{1-x1}N$ layer of the first conductivity type and in said $Al_{x2}Ga_{1-x2}N$ layer of the second conductivity type; and
   wherein a total thickness of said $Al_{x1}Ga_{1-x1}N$ layer of the first conductivity type and said $Al_{x2}Ga_{1-x2}N$ layer of the second conductivity type is at most 0.4 µm.

2. The light-emitting device according to claim 1, wherein said nitride semiconductor substrate is a GaN substrate.

3. The light-emitting device according to claim 2, wherein said dislocation density is a threading dislocation density of said nitride semiconductor substrate.

4. The light-emitting device according to claim 1, wherein said nitride semiconductor substrate is an $Al_{x1}Ga_{1-x1}N$ substrate ($0<x \leq 1$).

5. The light-emitting device according to claim 4, wherein a band gap energy of said $Al_{x1}Ga_{1-x1}N$ substrate ($0<x \leq 1$) is not more than an energy corresponding to a wavelength of said ultraviolet light emitted by the light-emitting layer including said InAlGaN quaternary alloy.

6. The light-emitting device according to claim 1, wherein said first GaN layer is a nitride semiconductor layer of the first conductivity type formed of a material of which said nitride semiconductor substrate is formed, between said nitride semiconductor substrate and said $Al_{x1}Ga_{1-x1}N$ layer of the first conductivity type.

7. The light-emitting device according to claim 1, further comprising:
   a first electrode formed on a second main surface of said nitride semiconductor substrate opposite to said first main surface; and
   a second electrode paired with said first electrode and formed above said $Al_2Ga_{1-x2}N$ layer of the second conductivity type.

8. The light-emitting device according to claim 1, further comprising an $In_xAl_yGa_{1-x-y}N$ ($0<x<0.2$, $0<y<0.5$) layer having thickness of 10-200 nm between said light-emitting layer and said nitride semiconductor substrate.

9. The light-emitting device according to claim 1, wherein said device exhibits a light emission output of the ultraviolet light with a linear relationship to an input current applied to said device up to an applied current level of at least 300 mA.

10. The light-emitting device according to claim 9, wherein said applied current level is 500 mA.

11. The light-emitting device according to claim 1, wherein said wavelength range is further limited to a range from 330 nm to 364 nm, and said InAlGaN quaternary alloy of said light-emitting layer has a band gap corresponding to said wavelength range from 330 nm to 364 nm.

12. The light-emitting device according to claim 1, wherein $0<x1<0.5$ and $0<x2<0.5$.

13. An ultraviolet light-emitting device adapted to emit ultraviolet light in a wavelength range from 330 nm to less than 365 nm, said device comprising:
   a nitride semiconductor substrate having a dislocation density of at most 1E7 cm$^{-2}$;
   an $Al_{x1}Ga_{1-x1}N$ layer ($0<x1<1$) of a first conductivity type located above said substrate;
   an $Al_{x2}Ga_{1-x2}N$ layer ($0<x2<1$) of a second conductivity type located above said $Al_{x1}Ga_{1-x1}N$ layer of the first conductivity type;
   an ultraviolet light-emitting layer that is adapted to emit the ultraviolet light in the wavelength range from 330 nm to less than 365 nm, and that is located between said $Al_{x1}Ga_{1-x1}N$ layer of the first conductivity type and said $Al_{x2}Ga_{1-x2}N$ layer of the second conductivity type, and that is formed as a single layer comprising an InAlGaN quaternary alloy; and
   a first GaN layer of the first conductivity type and a second GaN layer of the second conductivity type arranged with said $Al_{x1}Ga_{1-x1}N$ layer of the first conductivity type and said $Al_{x2}Ga_{1-x2}N$ layer of the second conductivity type interposed between said first and second GaN layers;
   wherein said nitride semiconductor substrate is etched or abraded to have a remaining thickness not more than 100 μm and is located in a more distant position from said light-emitting layer than that of said $Al_{x1}Ga_{1-x1}N$ layer of the first conductivity type;
   wherein a composition ratio (x1, x2) of Al in said $Al_{x1}Ga_{1-x1}N$ layer of the first conductivity type and in said $Al_{x2}Ga_{1-x2}N$ layer of the second conductivity type is smaller than a composition ratio (1-x, 1-x2) of Ga in said $Al_{x1}Ga_{1-x1}N$ layer of the first conductivity type and in said $Al_{x2}Ga_{1-x2}N$ layer of the second conductivity type; and
   wherein a total thickness of said $Al_{x1}Ga_{1-x1}N$ layer of the first conductivity type and said $Al_{x2}Ga_{1-x2}N$ layer of the second conductivity type is at most 0.4 μm.

14. The light-emitting device according to claim 13, wherein said device exhibits a light emission output of the ultraviolet light with a linear relationship to an input current applied to said device up to an applied current level of at least 300 mA.

15. The light-emitting device according to claim 14, wherein said applied current level is 500 mA.

16. The light-emitting device according to claim 13, wherein said wavelength range is further limited to a range from 330 nm to 364 nm, and said InAlGaN quaternary alloy of said light-emitting layer has a band gap corresponding to said wavelength range from 330 nm to 364 nm.

17. The light-emitting device according to claim 13, wherein $0<x1<0.5$ and $0<x2<0.5$.

* * * * *

UNITED STATES PATENT AND TRADEMARK OFFICE
CERTIFICATE OF CORRECTION

| | |
|---|---|
| PATENT NO. | : 7,859,007 B2 |
| APPLICATION NO. | : 10/916802 |
| DATED | : December 28, 2010 |
| INVENTOR(S) | : Hideki Hirayama et al. |

It is certified that error appears in the above-identified patent and that said Letters Patent is hereby corrected as shown below:

Title page,
Item [75], Inventors:
Line 1, replace "Wako" by --Wako-shi--;
Lines 2 and 3, replace "Itami" by --Itami-shi--;

Column 1,
Line 8, replace "More-specifically" by --More specifically--;

Column 4,
Line 13, replace "5E61 cm$^2$" by --5E6/cm$^2$--;

Column 5,
Line 24, replace "LED-using" by --LED using--;

Column 6,
Line 24, replace "gap-energy" by --gap energy--;
Line 47, replace "Al$_x$Ga$_{1-x1}$N" by --Al$_{x1}$Ga$_{1-x1}$N--;

Column 8,
Line 45, replace "Al$_{x1}$Ga$_{1-x1}$N" by --Al$_x$Ga$_{1-x}$N--;
Line 48, replace "Al$_{x1}$Ga$_{1-x1}$N" by --Al$_x$Ga$_{1-x}$N--;
Line 64, replace "Al$_2$Ga$_{1-x2}$N" by --Al$_{x2}$Ga$_{1-x2}$N--;

Column 10,
Line 12, replace "(1-x, 1-x2)" by --(1-x1, 1-x2)--.

Signed and Sealed this
Fifteenth Day of May, 2012

David J. Kappos
*Director of the United States Patent and Trademark Office*